(12) United States Patent
Kudou

(10) Patent No.: US 8,729,608 B2
(45) Date of Patent: May 20, 2014

(54) SEMICONDUCTOR DEVICE AND METHOD OF MANUFACTURING THE DEVICE

(75) Inventor: Chiaki Kudou, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/811,584

(22) PCT Filed: Sep. 10, 2012

(86) PCT No.: PCT/JP2012/005717
§ 371 (c)(1),
(2), (4) Date: Jan. 22, 2013

(87) PCT Pub. No.: WO2013/114477
PCT Pub. Date: Aug. 8, 2013

(65) Prior Publication Data
US 2014/0008664 A1   Jan. 9, 2014

(30) Foreign Application Priority Data

Jan. 31, 2012   (JP) ................................. 2012-017812

(51) Int. Cl.
*H01L 27/148*   (2006.01)
*H01L 29/76*    (2006.01)
*H01L 21/338*   (2006.01)
*H01L 21/336*   (2006.01)

(52) U.S. Cl.
USPC ........... 257/220; 257/330; 438/182; 438/192; 438/259; 438/270

(58) Field of Classification Search
USPC .......... 438/182, 192, 259, 270; 257/220, 330, 257/350
See application file for complete search history.

(56) References Cited

U.S. PATENT DOCUMENTS

| 5,541,425 A | 7/1996 | Nishihara |
| 5,795,792 A | 8/1998 | Nishihara |
| 5,915,180 A | 6/1999 | Hara et al. |
| 2001/0008291 A1 | 7/2001 | Aoki et al. |

(Continued)

FOREIGN PATENT DOCUMENTS

| CN | 1527369 A | 9/2004 |
| DE | 10 2004 010 127 | 9/2004 |

(Continued)

OTHER PUBLICATIONS

International Search Report mailed Nov. 13, 2012 issued in corresponding International Application No. PCT/JP2012/005717.

*Primary Examiner* — Hsien Ming Lee
(74) *Attorney, Agent, or Firm* — McDermott Will & Emery LLP

(57) ABSTRACT

A semiconductor device (100) includes a substrate (1) having a semiconductor layer (102); a trench (12) in the semiconductor layer (102); a gate insulating film (11) covering a periphery and an inner surface of the trench (12); a gate electrode (8) including a portion filling the trench (12) and a portion around the trench (12), and provided on the gate insulating film (11); an interlayer insulating film (13) on the gate electrode (8); and a hollow (50) above and around the trench (12), and between the gate electrode (8) and the gate insulating film (11). Above the trench (12), the hollow (50) protrudes inside the trench (12) from a plane extending from an upper surface of the gate insulating film (11) at a portion covering the side surface of the trench (12) with a flat shape.

19 Claims, 7 Drawing Sheets

(56) References Cited

U.S. PATENT DOCUMENTS

| | | |
|---|---|---|
| 2001/0042885 A1 | 11/2001 | Nakamura |
| 2002/0167046 A1 | 11/2002 | Aoki et al. |
| 2004/0173845 A1 | 9/2004 | Aoki |
| 2005/0090060 A1 | 4/2005 | Aoki et al. |
| 2008/0237605 A1 | 10/2008 | Murata et al. |
| 2008/0265427 A1 | 10/2008 | Hirler et al. |
| 2009/0014758 A1* | 1/2009 | Nogami et al. ............... 257/280 |

FOREIGN PATENT DOCUMENTS

| | | |
|---|---|---|
| DE | 10 2007 020 263 A1 | 11/2008 |
| JP | 06-053514 A | 2/1994 |
| JP | 07-086589 A | 3/1995 |
| JP | 07-249769 A | 9/1995 |
| JP | 07-326755 A | 12/1995 |
| JP | 11-031815 A | 2/1999 |
| JP | 2001-196587 A | 7/2001 |
| JP | 2004-158807 A | 6/2004 |
| JP | 2004-266140 A | 9/2004 |
| JP | 2007-043208 A | 2/2007 |
| JP | 2007-242943 A | 9/2007 |
| JP | 2007-281512 A | 10/2007 |
| JP | 2008-270794 A | 11/2008 |
| JP | 2009-027139 A | 2/2009 |
| JP | 2012-119711 A | 6/2012 |

* cited by examiner (a)

(b)

(a)

(b)

(c)

(a)

(b)

(c)

(a)

(b)

(a)

(b)

SEMICONDUCTOR DEVICE AND METHOD OF MANUFACTURING THE DEVICE

RELATED APPLICATIONS

This application is the U.S. National Phase under 35 U.S.C. §371 of International Application No. PCT/JP2012/005717, filed on Sep. 10, 2012, which in turn claims the benefit of Japanese Application No. 2012-017812, filed on Jan. 31, 2012, the disclosures of which Applications are incorporated by reference herein.

TECHNICAL FIELD

The present disclosure relates to semiconductor devices and methods of manufacturing the devices, and more particularly to semiconductor devices having a trench gate structure, and methods of manufacturing the devices.

BACKGROUND ART

In recent years, semiconductor devices having a trench gate structure have been focused on. While a channel region is formed on the surface of a semiconductor layer in a semiconductor device having a planar gate structure, a channel region is formed on the sidewall surface of a trench provided in a semiconductor layer in a semiconductor device having the trench gate structure. Thus, in a semiconductor device having the trench gate structure, miniaturization and reduction in on-resistance can be expected more than in a semiconductor device having the planar gate structure. Therefore, semiconductor devices having the trench gate structure are being developed particularly in the field of power devices.

Specifically, since miniaturization is not limited by the effect of junction field effect transistors (JFETs), a semiconductor device having the trench gate structure has the advantages of miniaturizing a trench, and reducing on-resistance and switching loss.

However, semiconductor devices having the trench gate structure have the problem of increasing gate resistance as a result of reduction in the cross-sectional area of a gate electrode with the miniaturization of a trench.

In order to address the problem, extending a gate electrode to the periphery of a trench, i.e., forming a T-shaped gate electrode is considered to mitigate an increase in gate resistance (see, for example, Patent Document 1).

In a semiconductor device having the trench gate structure, forming an appropriate gate insulating film in a trench is important. Specifically, the thickness of the gate insulating film needs to be reduced on the sidewall surface of the trench, in which a channel region is formed, to reduce the threshold voltage at switching, and the thickness of the gate insulating film needs to be increased at the bottom of the trench to avoid electric field concentration.

However, if the thickness of the entire gate insulating film is increased to increase the breakdown electric field, the threshold voltage at switching increases. On the other hand, if the thickness of the entire gate insulating film is reduced to lower the threshold voltage at switching, the electric field concentration occurs at the bottom of the trench.

Then, for example, Patent Document 2 suggests forming a thicker gate insulating film at the bottom of a trench using the difference in the orientation between the sidewall surface and the bottom of the trench. For example, Patent Document 3 suggests selectively forming a mask on the sidewall surface of a trench in forming a gate insulating film, thereby preventing formation of an oxide film on the sidewall surface of the trench and forming the thick gate insulating film on the portions other than the sidewall surface of the trench.

CITATION LIST

Patent Document

PATENT DOCUMENT 1: Japanese Patent Publication No. 2007-281512
PATENT DOCUMENT 2: Japanese Patent Publication No. H7-326755
PATENT DOCUMENT 3: Japanese Patent Publication No. 2007-242943

SUMMARY OF THE DISCLOSURE

Technical Problem

However, the conventional semiconductor devices having the trench gate structure have the following problems.

First, as shown in Patent Document 1, where the T-shaped gate electrode is formed, the gate insulating film needs to be formed on the portion of the semiconductor layer around the trench. However, if the gate insulating film formed around the trench has a small thickness, the parasitic capacitance between a gate and the semiconductor layer around the trench (hereinafter also referred to as gate-semiconductor layer capacitance) increases, thereby causing a delay and reducing the breakdown voltage of the gate insulating film between the gate and the semiconductor layer. Therefore, where the gate electrode has the T-shape, not only the thickness of the gate insulating film on the side surface of the trench but also the thickness of the gate insulating film around the trench is preferably controlled.

In addition, since the electric field concentrates at the shoulder of the trench, the breakdown voltage decreases even when the gate insulating film is formed to have the same thickness on the shoulder and on the sidewall.

However, as shown in Patent Document 2, where the thickness of the gate insulating film is controlled by utilizing the orientation of a substrate, a substrate with a particular orientation is required, thereby increasing the manufacturing costs.

As shown in Patent Document 3, where the mask is formed on the sidewall surface of the trench to selectively form the thick gate insulating film on the portions other than the sidewall surface of the trench, the steps of forming and removing the mask are needed. This results in complicated manufacturing steps to increase the manufacturing costs and the cycle time.

The above-described problems occur in a silicon semiconductor device as well as in a semiconductor device made of wide bandgap semiconductor such as silicon carbide (SiC). In particular, the dielectric constant of SiC (e.g., 9.7 of 4H—SiC) is smaller than the dielectric constant (11.9) of Si and is less different from the dielectric constant (3.8) of $SiO_2$. Thus, a high electric field is applied to a gate insulating film in a semiconductor device made of SiC. As a result, where a gate electrode has a T-shape in a semiconductor device made of SiC, the problems such as an increase in the gate-semiconductor layer capacitance and a decrease in the breakdown voltage of the gate insulating film between the gate and the semiconductor layer become more serious.

In view of the problems, it is an objective of the present disclosure to easily provide a semiconductor device having a trench gate structure, which reduces gate-semiconductor layer capacitance and increases a breakdown voltage of a gate insulating film between a gate and a semiconductor layer.

Solution to the Problem

In order to achieve the objective, a semiconductor device according to the present disclosure includes a substrate having a semiconductor layer on a principal surface thereof; a trench provided in the semiconductor layer; a gate insulating film covering a top of the semiconductor layer around the trench, and a bottom and a side surface of the trench; a gate electrode including a portion filling the trench and a portion expanding around the trench, and provided on the gate insulating film; an interlayer insulating film covering a top of the gate electrode; and a hollow provided in a region above and around the trench, and between the gate electrode and the gate insulating film. Above the trench, at least part of the hollow protrudes inside the trench from a plane extending from an upper surface of the gate insulating film at a portion covering the side surface of the trench with a flat shape.

In order to achieve the objective, a method of manufacturing a semiconductor device according to the present disclosure includes (a) preparing a substrate having a semiconductor layer on a principal surface thereof; (b) forming a trench in the semiconductor layer; (c) forming a gate insulating film covering a top of the semiconductor layer around the trench, and a bottom and a side surface of the trench; (d) forming an insulating film on the gate insulating film by plasma chemical vapor deposition; (e) forming on the gate insulating film and the insulating film, a gate electrode including a portion filling the trench and a portion expanding around the trench; (f) removing the insulating film; and (g) forming an interlayer insulating film covering a top of the gate electrode. In the (f), a hollow is provided in a region above and around the trench below the gate electrode by removing the insulating film. Above the trench, at least part of the hollow protrudes inside the trench from a plane extending from an upper surface of the gate electrode at a portion covering the side surface of the trench with a flat shape.

Advantages of the Disclosure

According to the above-described semiconductor device and method of manufacturing the device, the hollow is provided above the shoulder of the trench and the form of the hollow is determined, thereby easily reducing the gate-semiconductor layer capacitance and the breakdown caused by the electric field concentration between the gate and the semiconductor layer in the semiconductor device including the gate electrode expanding around the trench.

DESCRIPTION OF EMBODIMENTS

Figure 1:
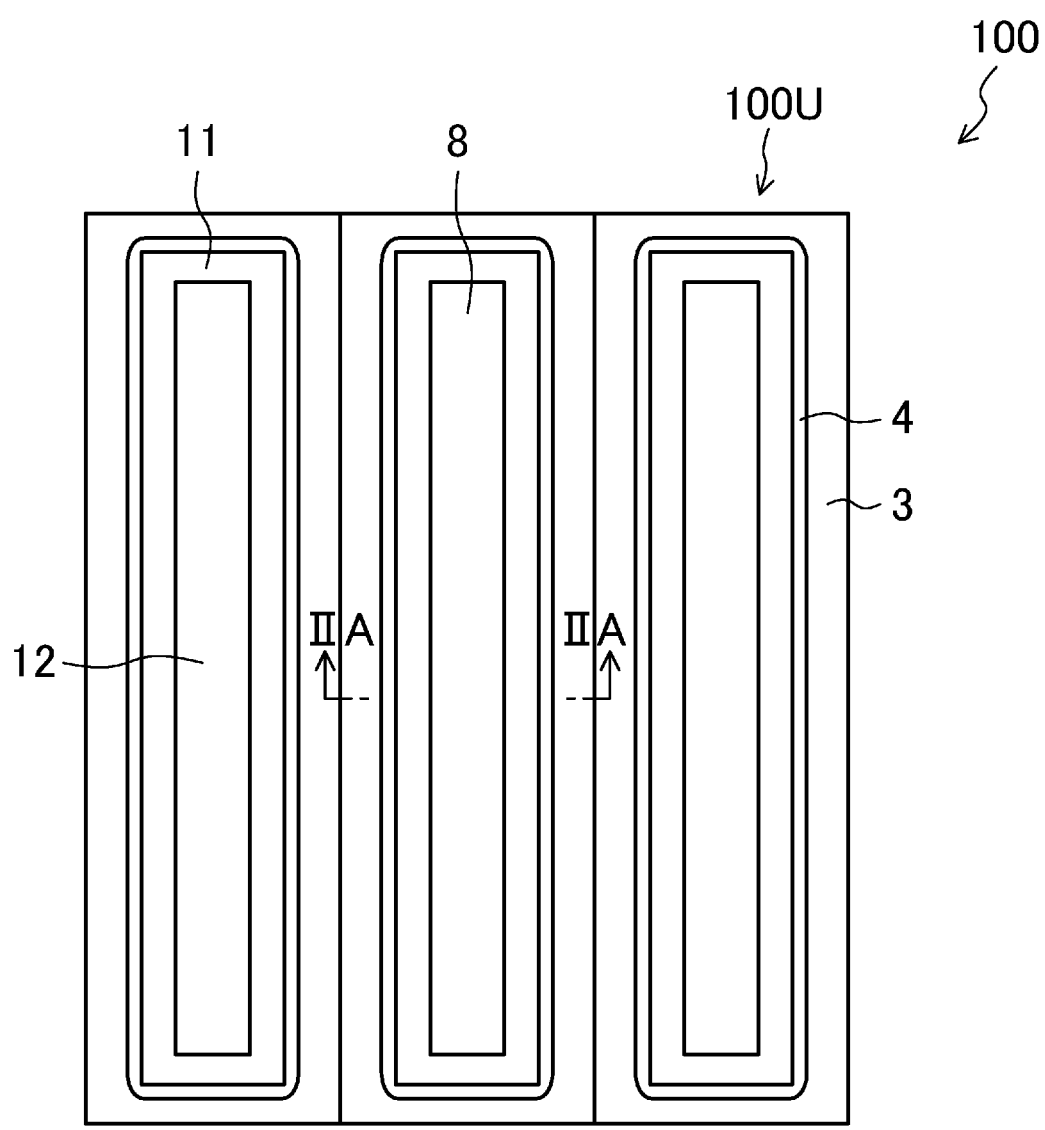
FIG. 1 schematically illustrates the structure of an example semiconductor device according to an embodiment of the present disclosure as viewed from above.

First, the thickness of a gate insulating film required in a semiconductor device having a trench gate structure will be described. In such a semiconductor device, a voltage of about ±20 V is applied to a gate electrode. At this time, the voltage of a source is almost 0 V, and thus the voltage of ±20 V is applied between the gate electrode and a semiconductor layer. A conventional thermal oxide film has a breakdown field strength of 10 MV/cm or more. However, in order to secure the reliability in long-term use, the electric field strength acceptable in a semiconductor device is preferably sufficiently smaller than the breakdown field strength, for example, from about 3 MV/cm to about 4 MV/cm.

For example, the gate insulating film has a thickness of about 70 nm on the sidewall of a trench. Where the gate insulating film is formed by thermal oxidation using a SiC semiconductor substrate having the (0001) Si plane as the principal surface, and where the gate insulating film has a thickness of 70 nm on the (11-20) plane, which is a sidewall of the trench ("-2" means 2 bars); the gate insulating film has a thickness of 30 nm or less on the (0001) Si plane, which is the semiconductor principal surface. Thus, the electric field applied to the gate insulating film on the semiconductor principal surface is 10 MV/cm or more, thereby providing an insufficiently reliable gate insulating film. In addition, the capacitance between the gate electrode and the semiconductor layer becomes four times the capacitance in the case where the gate insulating film is formed to have the same thickness on the sidewall and on the principal surface of the semiconductor layer. The increase in the capacitance causes a delay to reduce the switching speed.

Where the formation of the gate insulating film is divided into a plurality of steps to increase the thickness of the gate insulating film on the upper surface of the semiconductor layer around the trench, the thickness on the side surface of the trench can be controlled independently from the thickness on the upper surface. However, an increase in the number of the steps is problematic. For example, the following steps are needed. First, a thermal oxide film is formed inside the trench, and then a polysilicon film is formed to cover the thermal oxide film. Next, a nitride film for covering the polysilicon film is formed, and the formed nitride film is selectively removed to form a mask covering the side surface of the trench and exposing the bottom of the trench. The exposed portion of the polysilicon film is thermally oxidized, and then the mask is removed. In addition, the unoxidized polysilicon film is removed.

The oxide film obtained by oxidizing polysilicon has smaller breakdown field strength than an oxide film obtained by oxidizing single crystal silicon. Thus, the thickness of the gate insulating film on the upper surface of the semiconductor layer around the trench needs to be greater than that in the case where a thermal oxide film is directly formed on the bottom of the trench. However, it is difficult to completely oxidize a thick polysilicon film into the inside, and it is not easy to form the thickness of the gate insulating film on the upper surface of the semiconductor layer around the trench much greater than the thickness on the side surface.

By contrast, the semiconductor device thought of by the present inventor is a semiconductor device having a trench gate structure, and has a hollow in the region around a trench and above the shoulder of the trench (i.e., near the upper portion of the side surface of the trench) and between a gate electrode and a gate insulating film. Having such a hollow corresponds to increasing the thickness of the gate insulating film around the trench and on the shoulder of the trench. This reduces the gate-semiconductor layer capacitance, and degradation of the gate insulating film caused by the electric field concentration at the shoulder of the trench.

The above-described hollow is formed by forming an insulating film on the portion of the semiconductor layer around the trench by plasma chemical vapor deposition (P-CVD) or plasma-enhanced chemical vapor deposition (PECVD), forming the gate electrode, and then removing the insulating film. Such the formation method of the hollow does not require any mask and does not make the steps complicated, and the thickness of the hollow is freely set independently from the thickness of the gate insulating film on the sidewall surface of the trench.

By using P-CVD, the thickness of the insulating film formed on the portion of the semiconductor layer around the trench becomes twice the thickness of the insulating film formed on the sidewall surface of the trench. In addition, an insulating film (e.g., a $SiO_2$ film) can be selectively formed on the semiconductor layer, and the insulating film can be formed on the shoulder of the trench to protrude inside the trench, etc. That is, where an insulating film is formed by P-CVD, the shape (what is called an "overhang") is obtained, in which the insulating film extends inside the trench from a plane extending from the flat portion of the side surface of the trench above the shoulder of the trench. Therefore, the hollow formed after removing the insulating film also has an overhang, thereby increasing the resistance of the gate insulating film to the breakdown caused by the electric field concentration at the shoulder of the trench.

As described above, a semiconductor device, which is excellent in high-frequency operation and reduces both of the gate resistance and the gate capacitance, is provided while less influencing the characteristics of the threshold voltage, etc.

Embodiment

—Structure of Semiconductor Device—

An example semiconductor device 100 and a method of manufacturing the device according to an embodiment of the present disclosure will be described below with a specific example. In this specification, while a "trench width direction" will be, for example, shown as the horizontal direction in FIG. 1, the magnitude relationship of t1, t2, t3, w1, and w2 are similar in the vertical direction and an oblique direction in FIG. 1. While an example will be described below where a trench has a rectangle plane, the planar shape of the trench is not limited thereto, and may be, for example, a square or other shapes.

The "upper surface of the gate insulating film" is a surface from the upper surface of the gate insulating film at the portion formed around the trench to the inner surface of the gate insulating film provided inside the trench.

Figure 2:
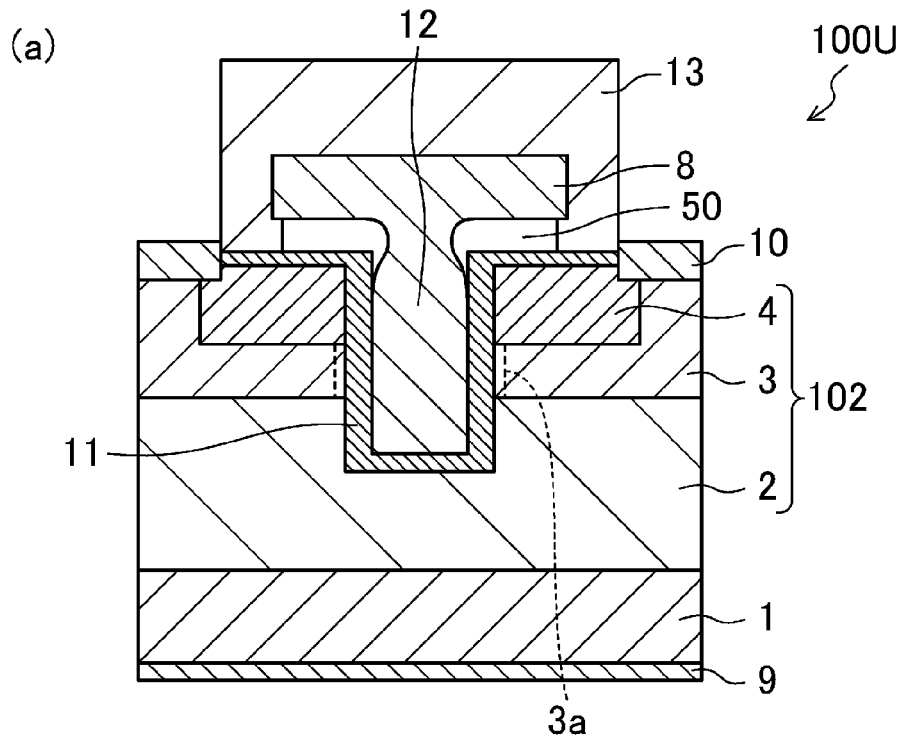
FIGS. 2(a) and 2(b) schematically illustrate the cross-sectional structure of the example semiconductor device according to the embodiment of the present disclosure.
Figure 2:
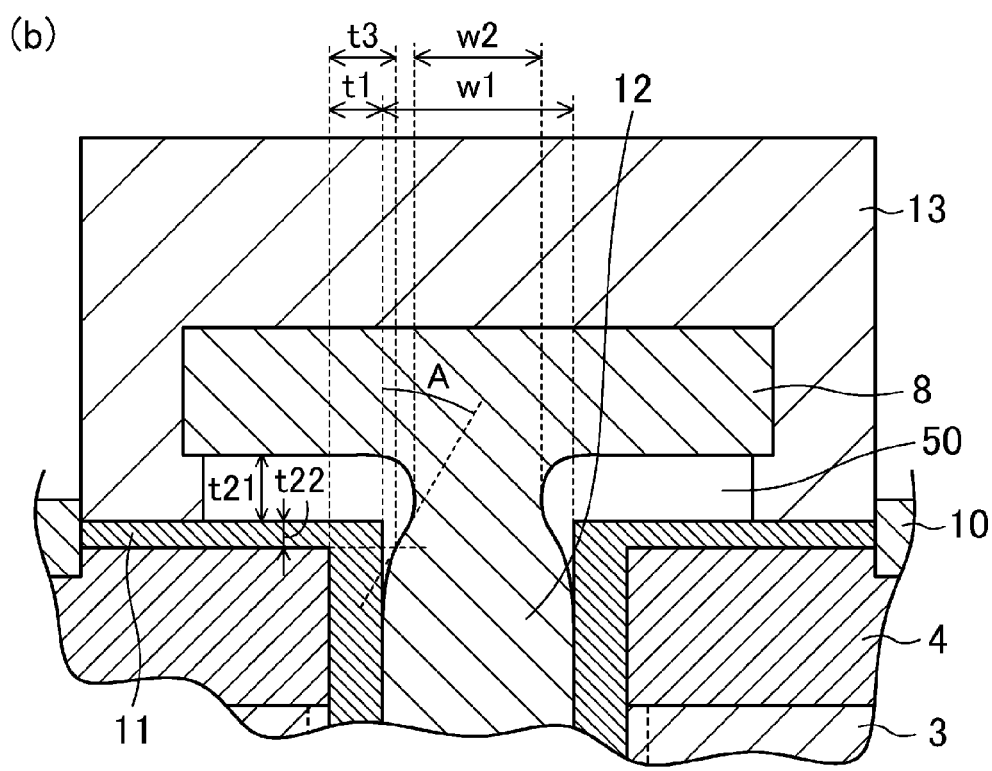

FIG. 1 is a top view illustrating the semiconductor device 100 according to the embodiment of the present disclosure including a plurality of unit cells 100U. FIG. 2(a) illustrates the cross-sectional structure of each unit cell 100U taken along the line IIA-IIA (i.e., the line orthogonal to the longitudinal direction of the trench) of FIG. 1. FIG. 1(b) is an enlarged view illustrating part of a region in the unit cell 100U shown in FIG. 1(a), in which a trench 12 is formed. For better understanding of the structure of the device, a source electrode 10 and an interlayer insulating film 13 are not shown in FIG. 1.

The semiconductor device 100 is a SiC-metal insulator semiconductor field effect transistor (MISFET) having a trench gate structure, and includes the plurality of unit cells 100U.

As shown in FIGS. 1, 2(a), and 2(b), each of the unit cells 100U is formed in a semiconductor layer 102 provided on a principal surface (i.e., a front surface) of a substrate 1.

The substrate 1 may be, for example, an n-type (i.e., a first conductivity type) SiC substrate having the (0001) Si plane as the principal surface. Note that the substrate 1 is not limited thereto, but may be a SiC substrate having the C-plane as the principal surface, or may be a substrate having any polytype structure. A semiconductor substrate such as a silicon substrate, which is made of a material other than SiC, may be used. A 4H—SiC substrate is used herein as an example.

The semiconductor layer 102 includes an n-type drift region 2 provided on the principal surface of the substrate 1, a p-type (i.e., a second conductivity type) body region 3 provided on the drift region 2, and an n-type source region 4 provided in an upper portion of the body region 3. The lower surface and the outer surface of the source region 4 are surrounded by the body region 3. While the semiconductor layer 102 is a SiC layer formed on the substrate 1 by epitaxial growth, it may be formed by implanting n-type or p-type impurity ions at the side of the principal surface of the substrate 1.

The semiconductor layer 102 includes the trench 12 which is a recess penetrating the source region 4 and the body region 3, and reaching the drift region 2. In this embodiment, the sidewall surface of the trench 12 is substantially perpendicular to the principal surface of the semiconductor layer 102. The trench 12 has a depth of, for example, about 1.5 μm, and the trench 12 has a width of, for example, about 1 μm. In this embodiment, as shown in FIG. 1, the trench 12 has a striped plane as viewed from the normal direction of the principal surface of the substrate 1.

A gate insulating film 11 is formed on the source region 4 around the trench 12, on the side surface of the trench 12, and on the bottom of the trench 12.

A gate electrode 8 made of a conductive film such as a polysilicon film fills the inside of the trench 12. The gate electrode 8 includes a portion filling the trench 12 and a portion expanding around the trench 12, and in addition, a connecting portion provided between the two portions. It has a narrowed portion in the width direction of the trench 12, and has a T-shaped cross-section. As such, since the gate electrode 8 expands around the trench, the gate resistance can be reduced as compared to the case where the gate electrode is formed only in the trench 12. Since the gate electrode 8 has the narrowed connecting portion, the connecting portion can be spaced apart from the source region 4, thereby reducing the electric field concentration near the upper periphery of the trench 12. Out of the portion of the gate electrode 8 filling the trench 12, the bottom and at least the portion of the side surface facing the channel formation region 3a are in contact with the gate insulating film 11.

A hollow 50 is formed in the region around and above the trench 12, and between the gate electrode 8 and the gate insulating film 11. As such, the gate electrode 8 is insulated from the semiconductor layer 102 by the gate insulating film 11 and the hollow 50.

The source electrode (i.e., a source-body electrode) 10, which is electrically coupled to the source region 4 and the body region 3, is formed on the semiconductor layer 102 to surround the trench 12. A drain electrode 9 is formed on the back surface (i.e., the surface opposite to the surface with the trench 12 etc.) of the substrate 1. In addition, the interlayer insulating film 13 covering the gate electrode 8 and the source electrode 10 is provided above the semiconductor layer 102, and the interlayer insulating film 13 includes a gate interconnect and a source interconnect (not shown). The gate interconnect and the source interconnect are both coupled to the gate electrode 8 and the source electrode 10 by contact plugs (not shown) formed in the interlayer insulating film 13.

When a voltage higher than a threshold is applied to the gate electrode 8 after applying a predetermined voltage between the source electrode 10 and the drain electrode 9, a current flows from the drain electrode 9 toward the source region 4 and the source electrode 10. At this time, a channel region, in which carriers flow, is formed in the body region 3 near the side surface of the trench 12 (i.e., the channel formation region 3a). The portion of the gate insulating film 11 in contact with the body region 3 serves as a substantial gate insulating film, which electrically insulates the channel formation region 3a from the gate electrode 8.

The surface of the channel formation region 3a (i.e., part of the side surface of the trench 12) is formed flat, and the portion of the gate insulating film 11 covering the channel formation region has a uniform thickness. Thus, the surface of the gate insulating film 11 on the channel formation region 3a is also formed flat. The expression "formed flat" includes fine unevenness of a surface or a non-uniform thickness within the scope of an error caused by different manufacturing conditions, etc. The gate insulating film 11 has a thickness ranging, for example, from about 40 nm to about 100 nm on the channel formation region 3a.

The upper surface of the gate insulating film 11 on the bottom of the trench 12 is lower than the lower surface of the body region 3.

The thickness t22 of the gate insulating film 11 at the portion covering the top of the semiconductor layer 102 (more specifically, the semiconductor layer 4) around the trench 12 is smaller than the thickness t1 of the gate insulating film 11 at the portion covering the side surface of the trench 12. The hollow 50 has a thickness of t21 at a portion located on the gate insulating film 11 around the trench 12.

The hollow 50 is formed at least at the shoulder of the trench 12 (i.e., around the corner of the upper portion of the side surface of the trench 12). That is, the hollow 50 includes, above the trench 12, the portion protruding inside the trench 12 from the plane extending from the upper surface of the gate insulating film 11 on the channel formation region 3a (i.e., the overhang above the trench 12). The hollow 50 is also provided to partially extend to the upper and peripheral portion of the trench 12.

Therefore, where the width w1 between the surfaces extending from the upper surface of the gate insulating film 11 on the channel formation region 3a on the both sides of the trench 12 is compared to the width w2 of the hollow 50 at the portion protruding inside the trench 12 most, w1>w2 is obtained.

Consider the length of the gate insulating film 11 in the width direction of the trench 12 at the portion covering the side surface of the trench 12 with a flat shape (e.g., the portion on the channel formation region 3a). Since the sidewall of the trench 12 is perpendicular to the principal surface of the semiconductor layer 102, the length is equal to the thickness t1 of the gate insulating film 11 at the portion covering the side surface of the trench 12. Where the length between the plane extending from the channel formation region 3a (i.e., the flat portion of the side surface of the trench 12) and the gate electrode 8 in the width direction of the trench 12 at the height of the principal surface of the semiconductor layer 102 is t3, t1<t3 is obtained.

Considering the shape of the surface of the hollow 50 at the gate electrode 8 (or the side surface of the gate electrode 8) as viewed from bottom to top, the surface bends inside the trench 12, then bends toward the opposite side (i.e., outside the trench 12), and has an inflection point between the bending portions. Where a tangent line is drawn at the inflection point, the tangent line is inclined inside the trench 12 from the side surface of the trench 12 at an angle A which is greater than 0°.

Since the above-described hollow 50 is formed, as will be described below, the capacitance between the gate electrode 8 and the source region 4, the breakdown caused by the electric field concentration, and the threshold voltage at switching can be reduced in each of the unit cells 100U.

First, the hollow 50 is provided on the gate insulating film 11 around the trench 12. Thus, the distance t2 between the source region 4 and the gate electrode 8 is the sum of the thickness t22 of the gate insulating film 11 and the thickness t21 of the hollow 50 on the source region 4, and greater than the thickness t1 of the gate insulating film 11 on the side surface of the trench 12.

In the case of SiC, the (0001) Si plane is oxidized at extremely low speed, and thus, where the principal surface is the (0001) Si plane, on which crystal growth is easily performed, and the gate insulating film 11 has a thickness of about 70 nm on the side surface of the trench 12, a $SiO_2$ film formed on the upper surface of the semiconductor layer 102 by thermal oxidation has a thickness of about 30 nm. Therefore, where the gate electrode 8 has a T-shaped cross-section and the hollow 50 is not provided, the gate electrode 8 is too close to the source region 4, thereby increasing the gate-source capacitance.

By contrast, in the method of manufacturing the semiconductor device 100, which will be described later, the thickness t21 of the hollow 50 around the trench 12 can be set independently from the thickness t1 of the gate insulating film 11 formed on the sidewall of the trench 12. For example, the thickness t21 of the hollow 50 can be easily set to about 100 nm. In this case, the thickness is about three times the thickness in the case where the gate insulating film is formed on the (0001) Si plane by thermal oxidation. In addition, where the oxide film has a dielectric constant of about 3.9, and the hollow has a dielectric constant of about 1, the total electrical thickness of about 12 times is formed. Therefore, the gate-semiconductor layer capacitance is reduced to about one-twelfth.

When a voltage is applied to the gate electrode 8, the electric field concentrates particularly at the shoulder of the trench 12, thereby causing breakdown. To address the problem, the hollow 50 protrudes inside the trench 12, as represented by the relationship of w1>w2, the angle A greater than 0°, etc. Thus, even when the electric field concentration occurs, the electric field strength decreases and the breakdown voltage increases, since the insulating film has a great thickness on the shoulder of the trench 12. In addition, since the hollow has a smaller dielectric constant than an oxide film, the electric field strength in reduced.

Since the hollow 50 is provided independently from the gate insulating film 11, the thickness t1 of the gate insulating film 11 on the side surface of the trench 12 can be set independently from the distance t2 between the source region 4 and the gate electrode 8 around the trench 12. Therefore, the thickness of the gate insulating film 11 on the side surface of the trench 12 (i.e., on the channel formation region 3a) can be freely set, thereby reducing the threshold voltage at switching.

—First Method of Manufacturing Semiconductor Device—

A method of manufacturing the semiconductor device 100 will be described hereinafter with reference to FIGS. 3(a)-3(c), 4(a)-4(c), 5(a), and 5(b).

First, as shown in FIG. 3(a), SiC is epitaxially grown on the principal surface of the substrate 1 having the (0001) Si plane as the principal surface, and then, the n-type drift region 2 and the p-type body region 3 are sequentially formed. Then, the n-type source region 4 is formed in the body region 3.

The substrate 1 may be a low-resistance n-type SiC substrate containing nitrogen at a concentration of about $3 \times 10^{18}$ cm$^{-3}$. The drift region 2 is doped with nitrogen at a concentration of about $8 \times 10^{15}$ cm$^{-3}$. The drift region 2 has a thickness of, for example, about 12 μm. The impurity concentration and the thickness of the drift region 2 may be determined by the required breakdown voltage, and are not limited to the described concentration and thickness. The impurity concentration, the thickness, etc. of the other elements are also examples and are not limited to the description.

The body region 3 may be doped with aluminum at a concentration of about $2 \times 10^{18}$ cm$^{-3}$. The body region 3 may have a thickness of about 1 μm.

The source region 4 may be formed by ion implantation, etc. That is, an implantation mask made of SiO$_2$ etc. is formed to expose the portion of the body region 3, which will be the source region 4. After that, n-type impurity ions (e.g., nitrogen ions) are implanted into the body region 3. The ion implantation is performed, for example, with an acceleration energy of 100 keV, and a dose of $5 \times 10^{15}$ cm$^{-2}$. After the implantation mask is removed, annealing is performed under an inert gas atmosphere at a temperature of about 1700° C. for about 30 minutes. This activates the implanted impurity ions, thereby obtaining the source region 4.

While an example has been described where the semiconductor layer 102 is formed by epitaxial growth, all or part of the semiconductor layer 102 may be formed by ion implantation, etc. on the SiC substrate. For example, p-type type impurities may be implanted into an n-type SiC substrate, and the upper portion of the SiC substrate may be the body region 3. After an n-type semiconductor layer is epitaxially grown on the SiC substrate, p-type impurities may be ion-implanted into the surface region of the formed n-type semiconductor layer to form the body region 3. In these cases, the region not doped with the p-type impurities is the drift region 2.

Next, as shown in FIG. 3(b), the trench 12 is formed in the semiconductor layer 102. For the formation, for example, a mask, which is a SiO$_2$ film exposing the center of the source region 4, is formed first. After that, part of the source region 4, the body region 3, and the drift region 2 are removed by reactive ion etching (RIE) using the mask. The trench 12 is formed to penetrate the body region 3, but not to penetrate the drift region 2, and so that the bottom is lower than the interface between the drift region 2 and the body region 3. For example, the trench 12 may have a depth of about 1.5 μm, and a width of about 1 μm. While in FIG. 3(b), an example has been described where the side surface of the trench 12 is perpendicular to the principal surface of the substrate 1, the structure is not limited thereto. (An example where the side surface of the trench 12 is not perpendicular to the principal surface of the substrate 1 will be described later.)

Then, as shown in FIG. 3(c), the gate insulating film 11 is formed on the semiconductor layer 102 around the trench 12, and on the side surface and the bottom of the trench 12. For the formation, for example, thermal oxidation may be used, and thermal treatment may be performed under a dry oxidation atmosphere at a temperature of about 1200° C. for about one hour. At this time, the gate insulating film 11 has the thickness t1 of about 70 nm on the side surface of the trench 12, and the thickness t22 of about 30 nm on the bottom of the trench 12 and around the trench 12 (on the semiconductor layer 102).

After that, as shown in FIG. 4(a), an insulating film 55 is deposited by P-CVD. By using P-CVD, the insulating film 55 is formed on the bottom of the trench 12 and around the trench 12 so that the thickness t3 on the principal surface of the semiconductor layer 102 is greater than the thickness t4 on the sidewall of the trench 12. The thickness t3 is about twice the thickness t4.

The insulating film 55 has a shape (an overhang) protruding inside the trench 12 from the end of the gate insulating film 11. Thus, the length t5 of the insulating film 55 in the width direction of the trench 12 at the height of the principal surface of the semiconductor layer 102 is greater than the thickness t4 on the sidewall of the trench 12. For example, the thickness t5 is about 1.3 times the thickness t4.

Considering the shape of the inner surface of the insulating film 55 as viewed from bottom to top, the surface bends inside the trench 12, then bends toward the opposite side, and has an inflection point between the bending portions. Where a tangent line is drawn at the inflection point, the tangent line is inclined inside the trench 12 in the height direction of the semiconductor device 100 at an angle A which is greater than 0°.

The insulating film 55 may have a thickness ranging, for example, from about 150 nm to about 500 nm (both inclusive). As a more specific example, the thickness may be about 350 nm.

The same form can be obtained by using any one of a silicon oxide film or a silicon nitride film as the insulating film 55. However, a silicon nitride film is preferably used to increase a selection ratio to the gate insulating film 11 in etching (e.g., wet-etching) the insulating film 55 in a later step.

The insulating film 55 is formed by P-CVD using a known device under known conditions. For example, where a silicon nitride film is formed, a parallel plate P-CVD device is used and a Si$_3$N$_4$ film is deposited. As example conditions, the electric power is about 500 W and the pressure in the chamber is about 70 Pa, and silane (SiH$_4$) is supplied at a flow rate of about 100 sccm (=1.69×10$^2$ Pa·L/s), ammonia (NH$_3$) at about 180 sccm (=3.04×10$^2$ Pa·L/s), and nitrogen (N$_2$) at about 500 sccm (=8.45×10$^2$ Pa·L/s). The unit sccm means cm$^{-3}$/min. at 0° C. under 1 atmosphere. The supply amount of silane, ammonia, and nitrogen may be controlled in accordance with the required growth rate. Silane, ammonia, and nitrogen are supplied from a side.

On the other hand, where a silicon oxide film is formed as the insulating film, a parallel plate P-CVD device is used, and a SiO$_2$ film is deposited. As example conditions, the electric power is about 200 W, the pressure in the chamber is about 133 Pa, and silane (SiH$_4$) is supplied at a flow rate of about 60 sccm (=1.01×10$^2$ Pa·L/s), N$_2$O at about 75 sccm (=1.27×10$^2$ Pa·L/s), and nitrogen (N$_2$) at about 1000 sccm (=1.69×10$^3$ Pa·L/s). The supply amount of silane, N$_2$O, and nitrogen may be controlled in accordance with the required growth rate. Silane, N$_2$O, and nitrogen are supplied from a side.

Depending on the conditions of the P-CVD, the rate (t4/t3) of the deposition on the sidewall of the trench 12 changes, but is not higher than 1. Where the thickness t4 of the insulating film 55 is smaller than 100 nm, t5/t4 is small, thereby causing difficulty in effectively increasing the thickness of the hollow above the shoulder of the trench 12. Therefore, the thickness t4 of the insulating film 55 is preferably greater than 100 nm, and is, for example, 300 nm.

Next, as shown in FIG. 4(b), the insulating film 55 deposited on the side surface of the trench 12 is removed by wet etching. The etched amount at this time is about slightly greater than t4. As a result, an insulating film 55a with a reduced thickness remains around the trench 12 and on the shoulder of the trench 12.

At this time, where a silicon nitride film is used as the insulating film 55, it may be etched by a polyphosphate mixture ($H_3PO_4$/$HNO_3$) heated at about 150° C. In wet etching of a silicon nitride film, the selection ratio, which is the ratio of the etching rate, can be 100 or more by controlling the temperature and the concentration of the etchant. Therefore, etching can be performed not to cause a substantial change of the gate insulating film 11.

On the other hand, where a silicon oxide film is used as the insulating film 55, it may be etched by a hydrofluoric acid solution. A silicon oxide film has a selection ratio of 5 or more by controlling the temperature and the concentration. In this case, as well, the insulating film 55 deposited on the sidewall of the trench 12 is selectively removed by controlling the etching time to mitigate reduction in the thickness of the gate insulating film 11 as much as possible. A silicon oxide film may be also removed by etching with vapor hydrofluoric acid. In this case, the selection ratio can be further increased.

After that, as shown in FIG. 4(c), a conductive film is formed on the entire surface of the semiconductor layer 102 including the inside of the trench 12. Then, a resist layer 24 is formed, which covers a portion above and around the trench 12 and exposes other portions. Next, the conductive film is etched (e.g., dry-etched) using the resist layer 24 as a mask to obtain the gate electrode 8 having a T-shaped cross-section. The gate electrode 8 is made of a polysilicon film, which is doped with phosphorus at a concentration of, for example, $1 \times 10^{20}$ cm$^{-3}$ or more, and has a thickness of about 600 nm on the semiconductor layer 102 around the trench 12. The polysilicon film is formed, for example, by low-pressure CVD (LP-CVD). The gate electrode 8 may be formed by a conductive film other than a polysilicon film.

Then, as shown in FIG. 5(a), the insulating film 55 is removed by isotropic etching to form the hollow 50. The isotropic etching of the insulating film 55 is preferably performed by the same method as described in FIG. 4(b).

After the insulating film 55 is removed, the gate insulating film 11 is formed on the sidewall of the trench 12, and the hollow 50 is formed on the principal surface of the semiconductor layer 102 around the trench 12. At this time, the form of the insulating film 55 is maintained. Thus, the hollow 50 has, above the shoulder of the trench 12, a portion protruding inside the trench 12 from a plane extending from the portion of the gate insulating film 11 covering the side surface of the trench 12. The hollow 50 has a length t6 in the width direction of the trench 12 at the height of the principal surface of the semiconductor layer 102. Similar to the description of FIGS. 2(b) and 4(a), the tangent line at the inflection point in the shape of the side surface of the hollow 50 is inclined inside the trench 12 from the height direction of the semiconductor device 100 at an angle A which is greater than 0°. Where the width w1 between the surfaces extending from the upper surface of the gate insulating film 11 on the both sides of the trench 12 is compared to the width w2 of the hollow 50 at the portion protruding inside the trench 12 most, w1>w2 is obtained.

Next, as shown in FIG. 5(b), the interlayer insulating film 13 is formed to cover the top of the gate electrode 8 and to have an opening above the source region 4 and the body region 3. At the same time as forming the opening in the interlayer insulating film 13, part of the gate insulating film 11 is removed to expose part of the source region 4 and the body region 3. Although not shown, an opening in the gate electrode 8 may be formed at the same time.

In this example, the gate insulating film 11 on the source region 4 and the body region 3 is removed at the same time as forming the opening in the interlayer insulating film 13. However, the portion of the gate insulating film 11 may be removed before the interlayer insulating film 13 is formed.

Then, the source electrode 10 is formed in contact with the body region 3 and the source region 4. For example, an conductive film is formed in the opening of the interlayer insulating film 13. The conductive film is, for example, a nickel (Ni) film, etc. and may be subjected to thermal treatment after the formation as appropriate. As a result, the source electrode 10 is obtained, which is in ohmic contact with the source region 4 and the body region 3.

The drain electrode 9 is formed on the back surface (i.e., the surface opposite to the principal surface) of the substrate 1. Although not shown, interconnects and plugs coupling the electrodes to the interconnects are formed as appropriate.

As described above, the semiconductor device 100 is manufactured. In this method, the P-CVD and the thermal oxidation are combined to form the gate insulating film 11, and the hollow 50, which functions as an electrically insulating film. As a result, the thickness of the gate insulating film 11 on the side surface of the trench 12 is easily set independently from the thickness of the hollow 50 provided around the trench 12 without forming a mask, etc. The thickness of the gate insulating film 11 on the sidewall of the trench 12 may be determined as appropriate depending on the required threshold voltage, breakdown voltage, etc.

First Variation

Figure 6:
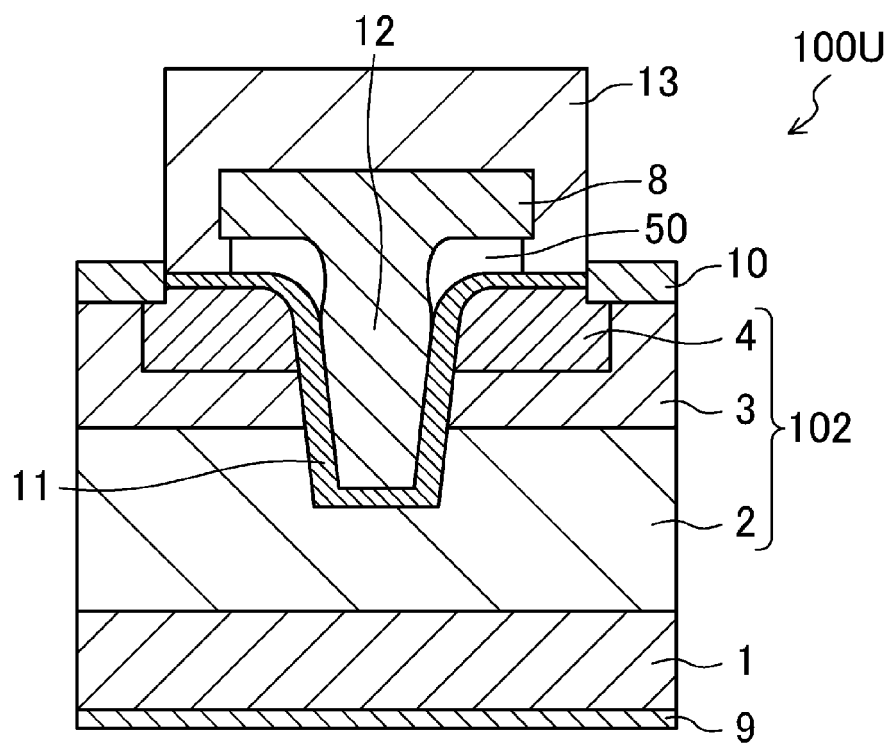
FIGS. 6(a) and 6(b) are cross-sectional views illustrating a semiconductor device according to a first variation of the embodiment of the present disclosure.
Figure 6:
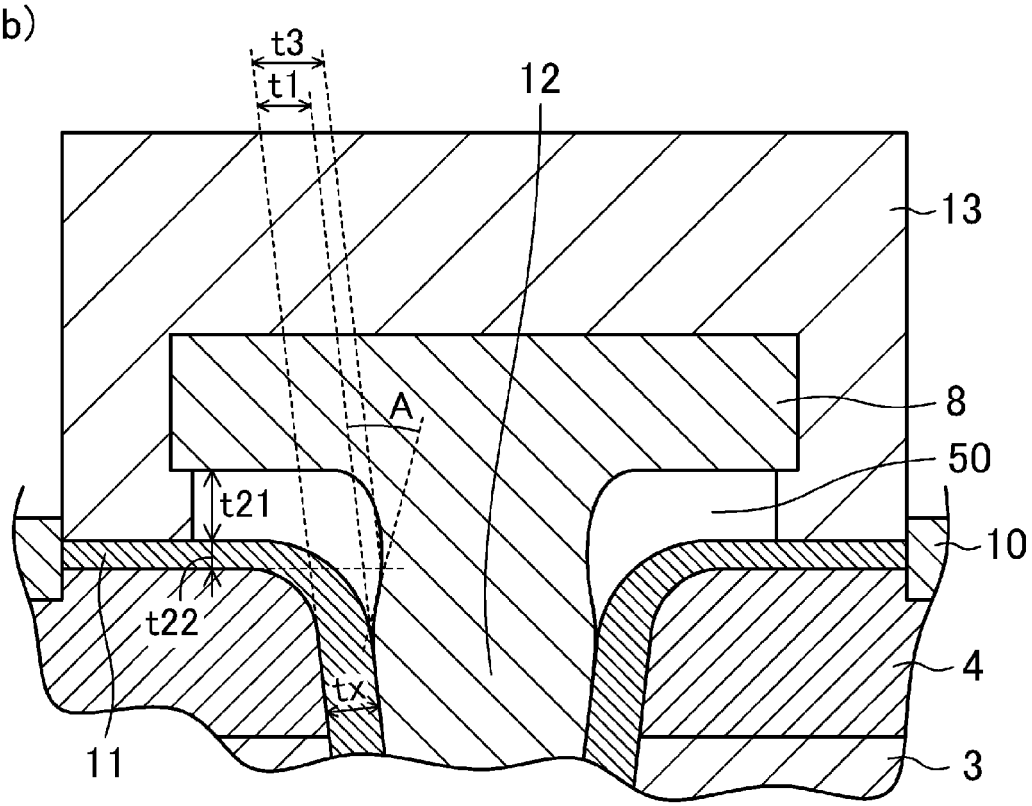

Next, a first variation of this embodiment will be described. FIG. 6(a) schematically illustrates the cross-section of a unit cell 100U in a semiconductor device according to a variation in the trench width direction. FIG. 6(b) is an enlarged view illustrating part of FIG. 6(a). In the figures, the same reference characters as those shown in FIGS. 2(a) and 2(b) are used to represent equivalent elements. Differences from the unit cell 100U in FIGS. 2(a) and 2(b) will be mainly described below.

In FIGS. 2(a) and 2(b), the side surface of the trench 12 is perpendicular to the principal surface of the semiconductor layer 102, and the upper and lower ends of the sidewall of the trench 12 are not rounded and angular. However, the shape is not limited thereto. As shown in FIGS. 6(a) and 6(b), the side surface of a trench 12 may be inclined from the principal surface of a semiconductor layer 102, and the trench 12 may be tapered. In addition, the sidewall of the trench 12 may be rounded at one or the both of the upper and lower ends.

In this case, as well, a gate insulating film 11 is formed to cover the top of the semiconductor layer 102 around the trench 12, and the side surface and the bottom of the trench. Since the upper end of the sidewall of the trench 12 is rounded, the portion of the gate insulating film 11 covering the upper end is rounded. A hollow 50 is formed in a region above the trench 12 and around the trench 12, and between the gate electrode 8 and the gate insulating film 11.

In this variation, the hollow 50 is provided to cover the entire rounded portion of the gate insulating film 11. This further reduces the electric field concentration around the upper end of the trench 12, as compared to the case where the hollow 50 covers part of the rounded portion of the gate insulating film 11.

The shapes and length of the hollow 50 and the gate insulating film 11 have the following relationships similar to FIGS. 2(a) and 2(b).

First, where the length of the gate insulating film 11 in the width direction of the trench 12 at the portion covering the side surface of the trench 12 (e.g., the portion on the channel formation region 3a) with a flat shape is t1, and the length between the plane extending from the flat portion of the side surface of the trench 12 and the gate electrode 8 in the width direction of the trench 12 at the height of the principal surface of the semiconductor layer 102 is t3, t1<t3 is obtained. Since the side surface of the trench 12 is inclined from the principal surface of the semiconductor layer 102, the thickness tx of the gate insulating film 11 at the portion covering the side surface of the trench 12 is different from t1.

Considering the shape of the surface of the hollow 50 at the gate electrode 8 (or the side surface of the gate electrode 8) as viewed from bottom to top, the surface bends inside the trench 12, then bends toward the opposite side (i.e., outside the trench 12), and has an inflection point between the bending portions. Where a tangent line is drawn at the inflection point, the tangent line is inclined inside the trench 12 from the side surface of the trench 12 at an angle A which is greater than 0°.

As described above, in the unit cell 100U, the capacitance between the gate electrode 8 and the source region 4, the breakdown caused by the electric field concentration, and the threshold voltage at switching can be reduced. Furthermore, since the side surface of the trench 12 is rounded at the upper and lower ends, the electric field concentration at the portion is reduced.

In order to round the upper end of the trench, for example, in the formation of the trench 12 by etching, the etching starts in the setting where a large amount of a reaction product is deposited on the side surface of the trench 12, and then the setting is changed so that the deposition amount gradually decreases. The upper end may be rounded by etching for making the upper and lower ends angular, and then annealing under a hydrogen atmosphere.

The side surface of the trench 12 may be perpendicular to the principal surface of the semiconductor layer 102, and the upper and/or lower end(s) of the sidewall of the trench 12 may be rounded. The side surface of the trench 12 may be inclined from the principal surface of the semiconductor layer 102, and the upper and lower ends of the sidewall of the trench 12 may not be rounded and angular.

Second Variation

Figure 7:
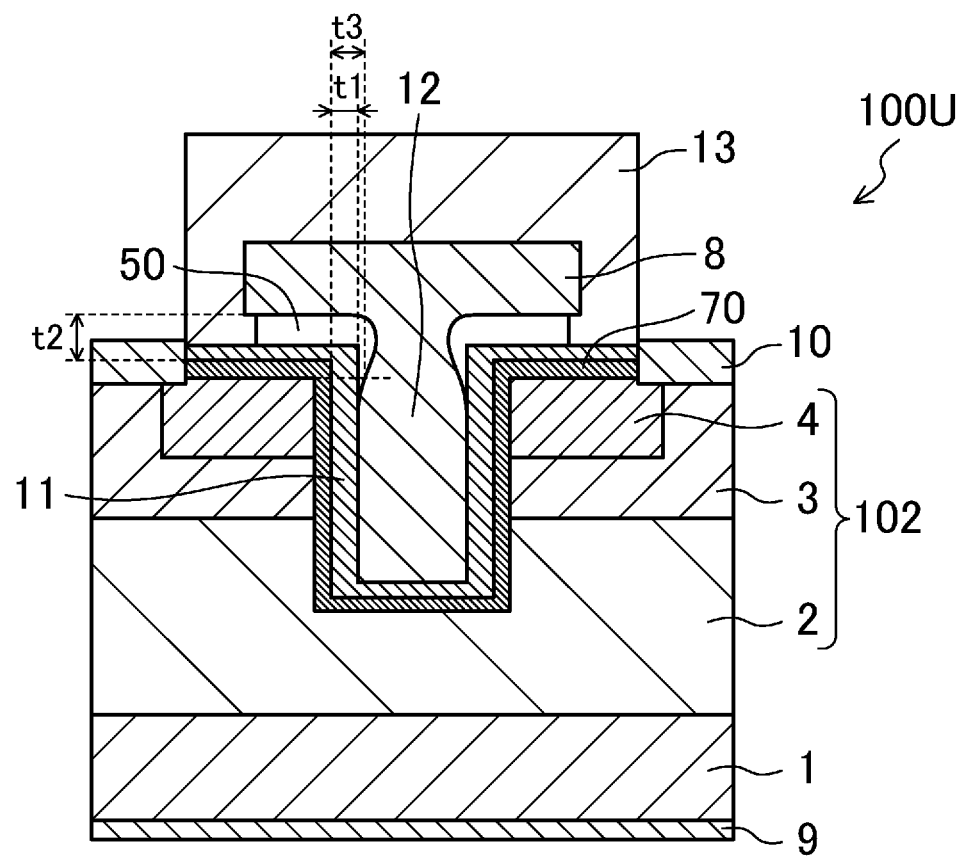
FIG. 7 is a cross-sectional view illustrating a semiconductor device according to a second variation of the embodiment of the present disclosure.

Next, a second variation of this embodiment will be described. FIG. 7 schematically illustrates the cross-section of a unit cell 100U in a semiconductor device according to another variation in the trench width direction. In the figure, the same reference characters as those shown in FIGS. 2(a) and 2(b) are used to represent equivalent elements. Differences from the unit cell 100U in FIGS. 2(a) and 2(b) will be mainly described below.

The unit cell 100U in FIGS. 2(a) and 2(b) is a MISFET having an inversion channel structure. On the other hand, the unit cell 100U of FIG. 7 includes an n-type (a first conductivity type) channel layer 70 provided between the side surface of a trench 12 and a gate insulating film 11, and has an accumulation channel structure. The advantages obtained by including a hollow 50 in addition to the gate insulating film 11 are also provided in this case.

A semiconductor device 100 according to this variation may be of a normally off type. In this case, carriers (electrons in this case) flow between the source electrode 10 (and the source region 4) and the drain electrode 9 via the channel layer 70 by applying a positive voltage to the gate electrode 8.

Figure 3:
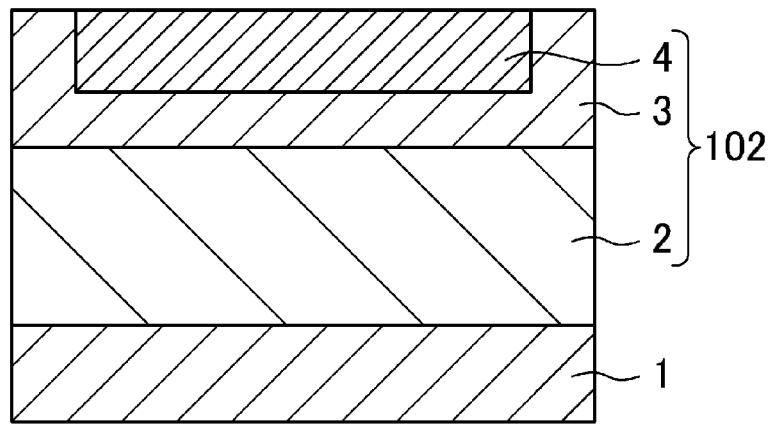
FIGS. 3(a)-3(c) are cross-sectional views illustrating manufacturing steps of the example semiconductor device according to the embodiment of the present disclosure.
Figure 3:
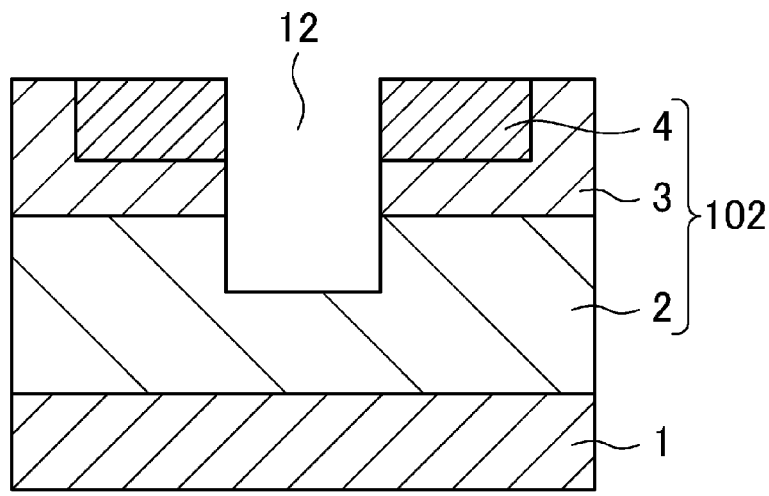
Figure 3:
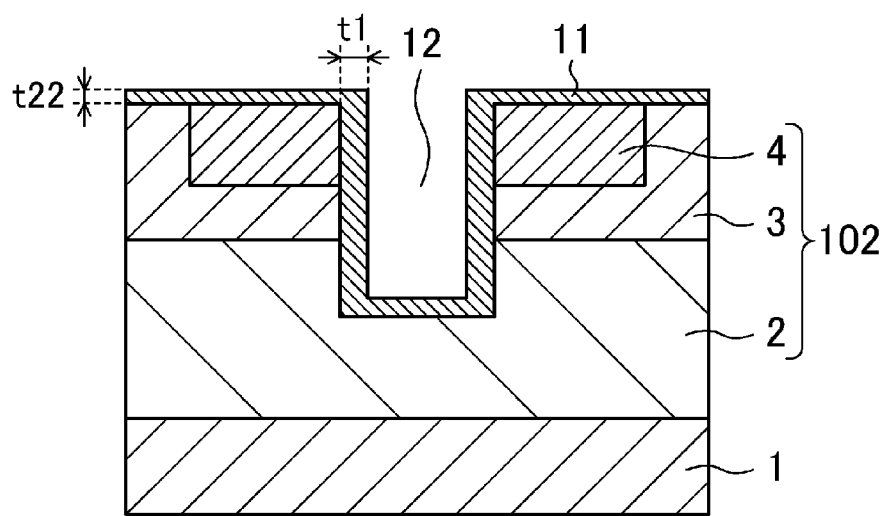
Figure 4:
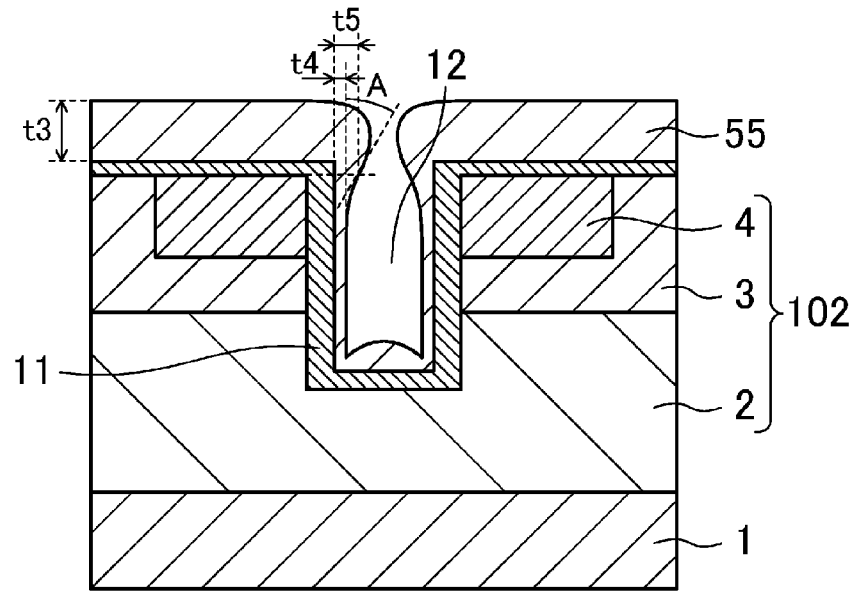
FIGS. 4(a)-4(c) are cross-sectional views illustrating manufacturing steps of the example semiconductor device according to the embodiment of the present disclosure following FIG. 3(c).
Figure 4:
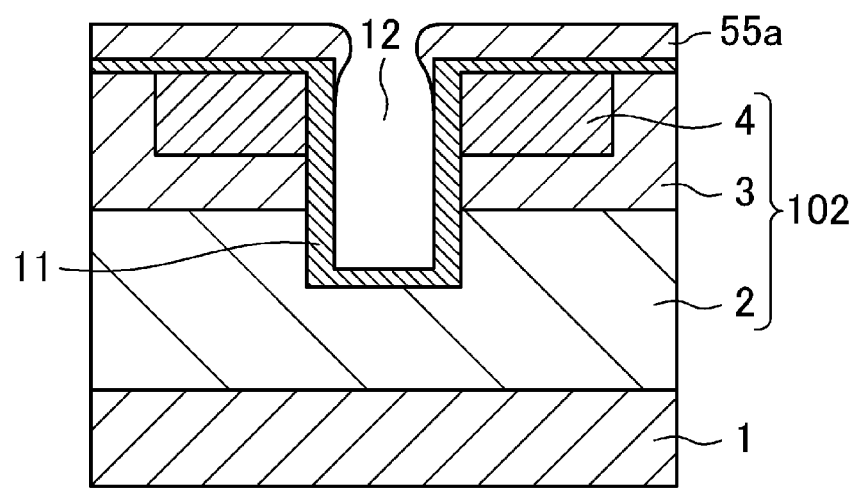
Figure 4:
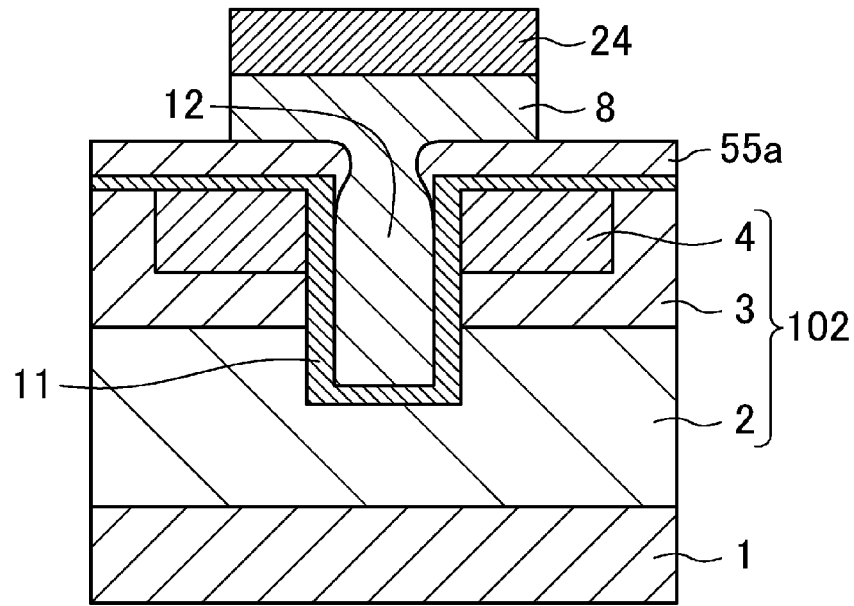
Figure 5:
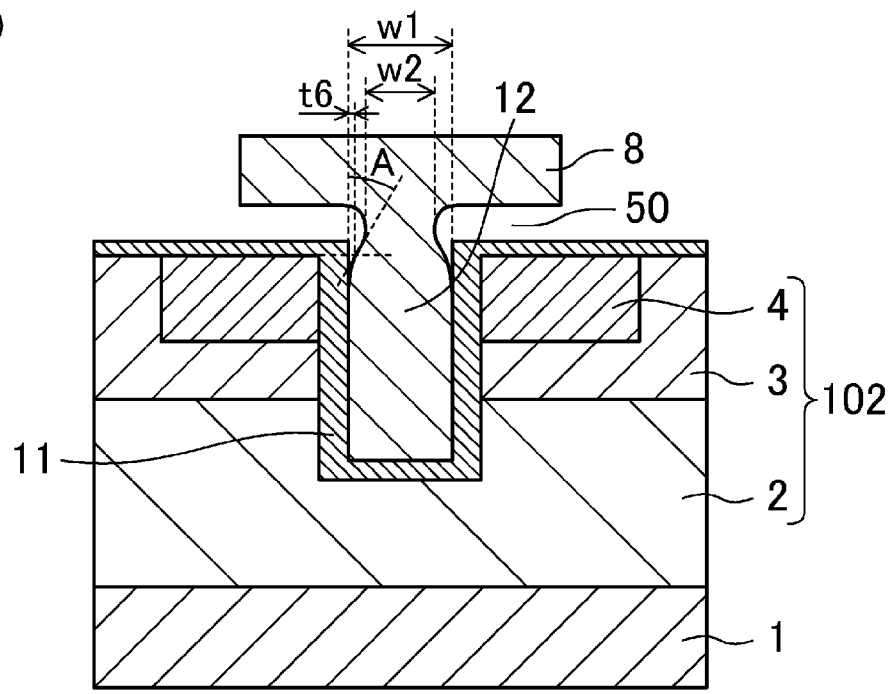
FIGS. 5(a) and 5(b) are cross-sectional views illustrating manufacturing steps of the example semiconductor device according to the embodiment of the present disclosure following FIG. 4(c).
Figure 5:
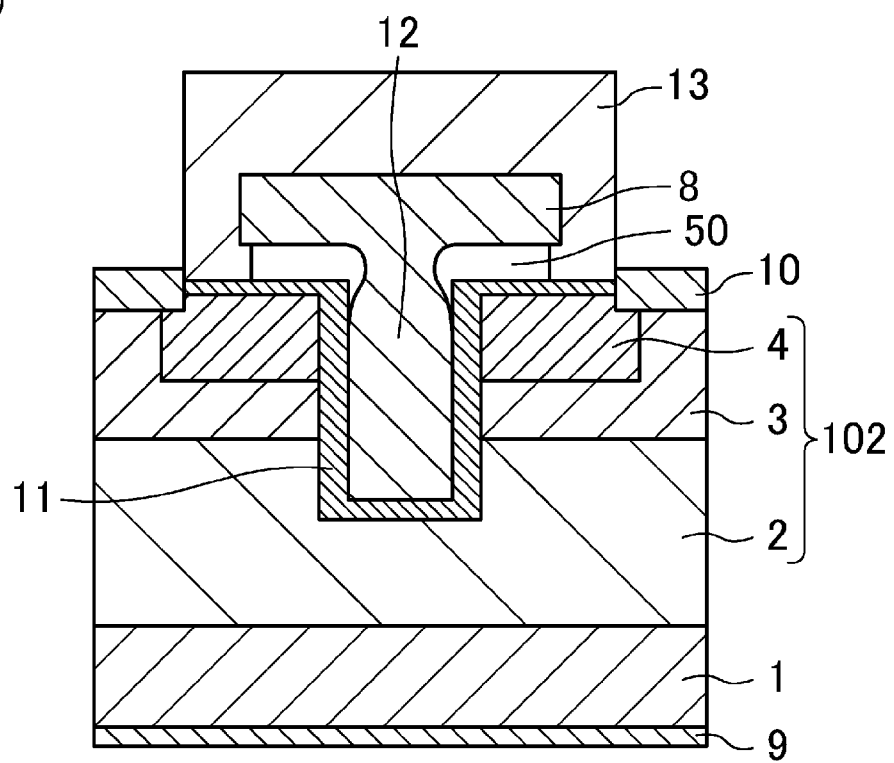

In order to form the channel layer 70, for example, a trench is formed in a semiconductor layer 102 similar to FIG. 3(b), and then an n-type SiC layer is epitaxially grown on the semiconductor layer 102 including the inside of the trench 12. After that, the steps similar to those in FIGS. 3(c)-5(b) may be performed. The channel layer 70 may be also formed by implanting n-type impurity ions into the sidewall of the trench 12 after the formation of the trench 12 and before the formation of the gate insulating film 11.

The n-type MISFETs have been described above. However, a p-type MISFET may be used. In this case, a substrate 1, a drift region 2, and a source region 4 have p-type conductivity, and a body region 3 has n-type conductivity. The semiconductor layer 102 may further include a region other than the drift region 2, the body region 3, and the source region 4. For example, in order to reduce the electric filed concentration, an impurity layer having a different conductivity type from the drift region 2 may be provided in the drift region 2 around the bottom of the trench 12.

Not only MISFETs but also various semiconductor devices including an electrode on a semiconductor layer with an insulating film interposed between may be formed similarly. For example, a substrate and a semiconductor layer formed directly thereon have different conductivity types, thereby forming an insulated gate bipolar transistor (IGBT). In an IGBT, the above-described source electrode 10, drain electrode 9, and source region 4 are called an emitter electrode, a collector electrode, and an emitter region, respectively.

Thus, in the above-described semiconductor device 100, where the drift region and the emitter region have n-type conductivity, and the substrate and the body region have p-type conductivity, an n-type IGBT can be obtained. At this time, an n-type buffer layer may be provided between the p-type substrate and the n-type drift layer. Where the drift region and the emitter region have p-type conductivity, and the substrate and the body region have n-type conductivity, a p-type IGBT can be obtained. At this time, a p-type buffer layer may be provided between the n-type substrate and the p-type drift layer. In these cases, as well, where the above-described gate insulating film 11 and hollow 50 are used, the capacitance between the gate electrode and the semiconductor layer decreases, and the electric field concentration in the upper periphery of the trench can be reduced.

While an example has been described above where the plurality of unit cells are arranged in parallel, the unit cells may be arranged in any form.

An example has been described where each trench 12 has the rectangular plane and the unit cells 100U are arranged so that the long sides of the plurality of trenches are parallel to each other. However, the planar shape of the trench is not limited thereto. It may be a trench having, for example, a square plane. (Note that in this case, the trench width direction may be the direction along the side.)

An example has been described above where the substrate 1 is made of 4H—SiC, and the semiconductor layer 102 is formed to have the (0001) Si plane as the principal surface. However, the semiconductor layer 102 may be formed on the (000-1) C-plane, and the drain electrode 9 may be formed on the (0001) Si plane. The orientation of the principal surface may be along other crystal planes. The Si plane or a predetermined offcut plane of the C-plane may be the principal surface of the substrate. Furthermore, a SiC substrate of other polytypes may be used.

Other than the SiC substrate, the present disclosure is applicable to a semiconductor device made of other wide bandgap semiconductor such as gallium nitride (GaN) or diamond. The structure of the present disclosure is applicable to a semiconductor device made of silicon.

An example has been described above where the interlayer insulating film 13 does not extend much below the gate insulating film 11, and the hollow is formed to the periphery of the end of the portion of the gate insulating film 11 expanding around the trench 12. This structure is preferable to reduce the capacitance between the gate insulating film 11 and the source region 4. However, the interlayer insulating film 13 may extend to a position near the trench 12 below the gate electrode 8. In this case, as well, the gate-semiconductor layer capacitance is reduced as compared to the structure in which the gate electrode 8 is in contact with the top of the gate insulating film 11 around the trench 12.

Other various elements such as the forms and sizes of the members, the impurity concentration, materials in the above-described semiconductor device and the variations can be modified as appropriate within the technical scope of the present disclosure.

INDUSTRIAL APPLICABILITY

The semiconductor device and the method of manufacturing the device according to the present disclosure is useful as various types of semiconductor devices including power devices, etc. and methods of manufacturing the devices.

DESCRIPTION OF REFERENCE CHARACTERS

1 Substrate
2 Drift Region
3 Body Region
3a Channel Formation Region
4 Source Region
8 Gate Electrode
9 Drain Electrode
10 Source Electrode
11 Gate Insulating Film
12 Trench
13 Interlayer Insulating Film
24 Resist Layer
50 Hollow
55 Insulating Film
55a Insulating Film
70 Channel Layer
100 Semiconductor Device
100U Unit Cell
102 Semiconductor Layer

The invention claimed is:

1. A semiconductor device, comprising:
a substrate having a semiconductor layer on a principal surface thereof;
a trench having a bottom, a first side surface and a second side surface opposite to the first side surface, and provided in the semiconductor layer;
a gate insulating film covering a top of the semiconductor layer around the trench, and the bottom, the first side surface and the second side surface of the trench;
a gate electrode including a portion filling the trench and a portion expanding around the trench, and provided on the gate insulating film;
an interlayer insulating film covering a top of the gate electrode; and
a hollow provided in a region above and around the trench, and between the gate electrode and the gate insulating film, wherein
above the trench, part of the hollow protrudes from a first plane toward a second plane, the first plane extending from a first interface between the gate insulating film on the first side surface of the trench and the gate electrode inside the trench, and the second plane extending from a second interface between the gate insulating film on the second side surface of the trench and the gate electrode inside the trench.

2. The semiconductor device of claim 1, wherein
an upper end of a sidewall of the trench has a round shape,
the portion of the gate insulating film covering the upper end of the sidewall of the trench has a round shape, and
the hollow is formed to cover the entire portion of the gate insulating film having the round shape.

3. The semiconductor device of claim 1, wherein
at a level of a principal surface of the semiconductor layer, a distance between a plane and the gate electrode is greater than a width of the gate insulating film inside the trench, the plane extending from a third interface between the gate insulating film and the first side surface of the trench.

4. The semiconductor device of claim 1, wherein:
the semiconductor layer includes:
a drift region having a first conductivity type;
a body region having a second conductivity type, and provided on the drift region; and
an impurity region having the first conductivity type, and provided in an upper portion of the body region,
the trench penetrates the impurity region and the body region, and reaches an inside of the drift region, and
an upper surface of the gate insulating film at a portion formed on the bottom of the trench is lower than a lower surface of the body region.

5. The semiconductor device of claim 1, wherein
the gate electrode further includes a connecting portion provided between the portion filling the trench and the portion expanding around the trench, and having a narrowed shape in the trench width direction.

6. The semiconductor device of claim 1, further comprising:
a channel layer having the first conductivity type, and provided at least between the first side surface of the trench and the gate insulating film.

7. The semiconductor device of claim 1, wherein
the semiconductor layer is made of silicon carbide.

8. The semiconductor device of claim 1, wherein
the substrate is a silicon carbide substrate, and
the principal surface of the substrate and a principal surface of the semiconductor layer are silicon surfaces.

9. A method of manufacturing a semiconductor device, the method comprising:
(a) preparing a substrate having a semiconductor layer on a principal surface thereof;
(b) forming a trench in the semiconductor layer, the trench having a bottom, a first side surface and a second side surface opposite to the first side surface;

(c) forming a gate insulating film covering a top of the semiconductor layer around the trench, and the bottom, the first side surface and the second side surface of the trench;

(d) forming an insulating film on the gate insulating film by plasma chemical vapor deposition;

(e) forming on the gate insulating film and the insulating film, a gate electrode including a portion filling the trench and a portion expanding around the trench;

(f) removing the insulating film; and (g) forming an interlayer insulating film covering a top of the gate electrode, wherein:

in the (f), a hollow is provided in a region above and around the trench below the gate electrode by removing the insulating film, and above the trench, at least part of the hollow protrudes from a first plane toward a second plane, the first plane extending from a first interface between the gate insulating film on the first side surface of the trench and the gate electrode inside the trench, and the second plane extending from a second interface between the gate insulating film on the second side surface of the trench and the gate electrode inside the trench.

10. The method of claim 9, wherein
at a level of a principal surface of the semiconductor layer, a distance between a plane and the gate electrode, the plane extending from a third interface between the gate insulating film and the first side surface of the trench, is greater than a width of the gate insulating film inside the trench.

11. The method of claim 9, wherein:
the (a) includes forming the semiconductor layer including a drift region having a first conductivity type, a body region having a second conductivity type, and provided on the drift region, and an impurity region having the first conductivity type, and provided in an upper portion of the body region, in the (b), the trench is formed to penetrate the impurity region and the body region and to reach an inside of the drift region, and in the (c), the gate insulating film is formed so that an upper surface of the gate insulating film at a portion formed on the bottom of the trench is lower than a lower surface of the body region.

12. The method of claim 9, wherein
in the (f), the insulating film is removed by isotropic etching.

13. The method of claim 9, further comprising:
between the (b) and (c), forming a channel layer having the first conductivity type to cover at least the first side surface of the trench, wherein in the (c), the gate insulating film is formed to cover the channel layer.

14. The method of claim 9, wherein
the semiconductor layer is made of silicon carbide.

15. The method of claim 9, wherein
the substrate is a silicon carbide substrate, and
the principal surface of the substrate and a principal surface of the semiconductor layer are silicon surfaces.

16. A semiconductor device, comprising:
a substrate having a semiconductor layer on a principal surface thereof;
a trench having a bottom, a first side surface and a second surface opposite to the first side surface, and provided in the semiconductor layer;
a gate insulating film covering a top of the semiconductor layer around the trench, and the bottom, the first side surface and the second side surface of the trench;
a gate electrode including a portion filling the trench and a portion expanding around the trench, and provided on the gate insulating film;
an interlayer insulating film covering a top of the gate electrode; and
a hollow provided in a region above and around the trench, and between the gate electrode and the gate insulating film, wherein:
the gate electrode has a T-shape in a cross section and has a head portion, a body portion disposed in the trench and a neck portion connecting the head portion and the body portion, and
in the cross section, a width of the neck portion decreases from a portion connected to the body portion, has a minimum width, and then increases as approaching to the head portion, in a direction from the body portion to the head portion of the gate electrode.

17. The semiconductor device of claim 16, wherein the width of the neck portion is smaller than a largest width of the body portion.

18. The semiconductor device of claim 16, wherein the minimum width of the neck portion locates above a principal surface of the semiconductor layer.

19. The semiconductor device of claim 16, wherein the width of the neck portion starts decreasing from a level below a principal surface of the semiconductor layer towards a portion of the minimum width.

* * * * *